(12) United States Patent
Oviedo Robles et al.

(10) Patent No.: US 12,174,542 B2
(45) Date of Patent: Dec. 24, 2024

(54) 3D NANOPRINTER

(71) Applicant: Sivananthan Laboratories, Inc., Bolingbrook, IL (US)

(72) Inventors: Juan Pablo Oviedo Robles, Plainfield, IL (US); Nigel Browning, Formby (GB); Hari Vemuri, New York, NY (US)

(73) Assignee: Sivananthan Laboratories, Inc., Bolingbrook, IL (US)

( * ) Notice: Subject to any disclaimer, the term of this patent is extended or adjusted under 35 U.S.C. 154(b) by 394 days.

(21) Appl. No.: 17/488,283

(22) Filed: Sep. 28, 2021

(65) Prior Publication Data

US 2022/0404708 A1 Dec. 22, 2022

Related U.S. Application Data

(60) Provisional application No. 63/212,486, filed on Jun. 18, 2021.

(51) Int. Cl.
*G03F 7/16* (2006.01)

(52) U.S. Cl.
CPC .................................. *G03F 7/162* (2013.01)

(58) Field of Classification Search
CPC .... H01L 21/68721; B05C 11/08; G03F 7/162
See application file for complete search history.

(56) References Cited

U.S. PATENT DOCUMENTS

| | | | |
|---|---|---|---|
| 5,654,546 A | 8/1997 | Lindsay | |
| 6,162,295 A * | 12/2000 | Davis | B05C 11/08 118/52 |
| 7,276,118 B2 | 10/2007 | Lim | |
| 8,058,628 B2 | 11/2011 | Zywno et al. | |
| 2002/0047542 A1 | 4/2002 | Higuchi | |
| 2002/0180133 A1 | 12/2002 | Oshima | |
| 2004/0101003 A1 | 5/2004 | Torazawa | |
| 2018/0114671 A1 | 4/2018 | Mitchels et al. | |
| 2018/0178227 A1 * | 6/2018 | Fedorov | B05B 5/0255 |

OTHER PUBLICATIONS

Samaneh Esfandiarpour et al.,Focused electron beam induced deposition of copper with high resolution and purity, Aqueous Solutions, 2017, Nanotechnology 28 125301.
J. S. Fisher et al., Rapid Electron Beam Writing of Topologically Complex 3D Nanostructures Using Liquid Phase Precursor,Nano Lett. 2015, 15, 12, 8385-8391.

* cited by examiner

*Primary Examiner* — David E Smith
*Assistant Examiner* — Hsien C Tsai
(74) *Attorney, Agent, or Firm* — Erickson Law Group, PC

(57) ABSTRACT

A 3D nanoprinter electron beam lithography module for a lithography system, such as a scanning electron microscope (SEM) or an environmental SEM (ESEM) with a beam blanker and electron beam lithography attachment, but generally applicable to any electron beam lithography capable system. The module is comprised of an in-situ spin-coating stage that is compatible with a cooling-SEM stage, with a spin-coating motor, a spin-coating sample stub, a liquid waste collector cup, a liquid dispensing arm holding a tube bundle that is connected via tubing to micro-syringe pumps or a pressure driven flow controller or pumps connected to fluid reservoirs, an electron beam scan generator control box, electrical feedthroughs, control electronics, and a computing system responsible for controlling the entire module. The dispensing arm can be controlled by a servo motor.

11 Claims, 4 Drawing Sheets

3D NANOPRINTER

This application claims the benefit of U.S. Provisional Application No. 63/212,486 filed Jun. 18, 2021.

BACKGROUND

Additive manufacturing technologies have been limited so far to the macroscopic scale, where a number of different approaches have been taken to the problem of depositing layers of material in a sequential manner. These include vat photopolymerization, material jetting, binder jetting, powder bed fusion, material extrusion, directed energy deposition, and sheet lamination. These are generally limited in resolution to several hundred microns.

One exception is 2-photon polymerization, which can achieve resolution in the hundreds of nanometers, but is limited in its choice of available materials to photopolymerizable resins. If one wishes to bridge the gap into the nanoscopic world while still using different materials, such as conductors, semiconductors, and insulators, one is left with traditional lithographic techniques of exposing a pattern in resist (whether it is with light or electrons), developing such pattern, and then using material deposition or removal techniques to create a thin film structure one layer at a time, a difficult 3D approach to manufacturing.

There is also the option available of gas phase electron or ion beam induced processing, which can add and subtract material and produce arbitrary nanoscale patterns, but is limited to 50 atomic % purity, and to small patterns with large processing times. In the case of ion beam processing, it also causes damage to the underlying layers, and leads as well to ion implantation and species intermixing.

The present inventors thus recognize a desire to enable rapid prototyping and manufacturing in 3D at the nanoscale with a variety of different materials.

SUMMARY

An exemplary embodiment of the invention includes a 3D nanoprinter electron beam lithography module that is intended for a lithography system, such as a scanning electron microscope (SEM) or an environmental SEM (ESEM) with a beam blanker and electron beam lithography attachment, but generally applicable to any electron beam lithography capable system. The exemplary embodiment module is comprised of an in-situ spin-coating stage.

The in-situ spin-coating stage can be compatible with a cooling-SEM stage. It can include a spin-coating motor, a spin-coating sample stub for holding a workpiece (or "sample" or "wafer" or "substrate") and that is driven by the motor, a sample holder rod holding the sample stub, a liquid waste collector cup for receiving liquid waste off the workpiece, a liquid dispensing arm having a discharge and holding a tube bundle that is connected via tubing to micro-syringe pumps or a pressure driven flow controller or pumps connected to fluid reservoirs, an electron beam scan generator control box, electrical feedthroughs, control electronics, and a computing system responsible for controlling the entire module. The dispensing arm can be controlled by a servo motor to position the discharge over a workpiece on the sample stub. The spin-coating motor can be connected to an external power supply and ground.

Another exemplary embodiment comprises a lithography system including:
a vacuum chamber;
a spin-coating sample stub within the chamber;
a spin-coating motor operable to spin the spin-coating sample stub, and connected to an external power supply;
a liquid dispensing arm connected via tubing to a selected supply of liquid for coating, the liquid dispensing arm arranged above the sample stub to deliver liquid onto a workpiece held on the sample stub; and
an electron or ion beam generator providing an electron and/or ion beam into the chamber and onto the workpiece.

A cooling stage can be used to cool the sample stub.

An electron beam lithography system can expose a lithography pattern on a sample as it is rotated at high speed (thousands of RPM) by the sample stub. An optical tracking system based on a multi-axis interferometer can track the position of the spin-coating sample from a ring mirror on the sample holder rod, while a rotary encoder can measure the angular position of the sample.

The sample holder rod can have X-Y motion within the spinning frame of reference as well as the ability to automatically balance a mass of the spinning components, including the workpiece or sample, the sample rod holder, the sample stub, the X-Y stage and the motor, due to this motion relative to the rotation axis during rotation at high RPM, to expose large area (dozens of cm) substrates.

The lithography system is based on liquid phase electron beam induced deposition (LP-EBID). The main components of current conventional LP-EBID systems are an electron microscope system with patterning capabilities (ESEM), a temperature-controlled substrate, and a liquid precursor wetting the surface of this substrate. In these systems, the electron beam interacts with the liquid precursor, precipitating high purity (over 90%) metals and semiconductors through the electrochemical reduction of metallic cations by secondary or solvated electrons. This has been already proven to deposit gold, palladium, silver, silicon, platinum, copper, binary alloys, and CdS semiconductors. The process has also been used with acid to etch copper, nickel, and silicon nitride. Thus, the 3D nanoprinter can be used both for the deposition as well as etching of material.

The exemplary embodiment of the invention facilitates the formation of thin liquid films for the deposition (or etching) of layer-by-layer 3D nanostructures, by the addition of in-situ spin-coating to the traditional LP-EBID paradigm.

Liquid phase electron beam-induced deposition reactants can be pre-loaded in syringes and placed in micro-syringe pumps inside of the ESEM sample chamber, or alternately they can be pumped and cooled from outside the chamber. A cooling-SEM stage is provided in the ESEM chamber and the spin-coating stage can be placed on top of the cooling-SEM stage. The purpose of the cooling-SEM stage is to cool down the spin-coating stage's sample stub so that the liquid phase reactants do not readily evaporate from it in vacuum. A liquid waste collector cup is located above and around the sample stub, which will prevent the liquid waste from the spin-coating action to reach other unintended areas of the microscope system. The waste may also be cooled down to avoid it from changing the pressure in the ESEM.

The spin-coating sample stub is affixed to a sample holder rod of the spin-coating stage. The liquid dispensing arm has a syringe tip connected via tubing to the syringes in the micro-syringe pumps. The dispensing arm swivels in and out of the center area of the sample stub, while controlled by a servo motor. All systems are controlled externally from the ESEM chamber using a computer interface.

To deposit material with the module, first, a sample or workpiece, such as a wafer or substrate of conductive material is prepared (for example, silicon), by patterning a numbered metal grid on its surface using traditional lithography approaches (such as metal lift-off). Then this sample is bonded to the spin-coating sample stub using silver epoxy. The purpose of the grid is to both find the region where the 3D nanoprinted form will be deposited, as well as to be a reference to find the center of rotation of the sample. Once the sample is mounted, the ESEM is pumped down to a pressure of 5.5 Torr. Also, the cooling-SEM stage is turned on, allowing for it to cool down the sample to approximately 3 C. The syringes are pre-loaded with precursors, such as aqueous solutions of $CuSO_4$:$H_2SO_4$ to obtain Cu, $H_2PtCl_6$ to obtain Pt, and $HAuCl_4$ to obtain Au, and HSQ in MIBK to obtain silicon oxide.

Once the sample is cold, the spin-coating stage's motor starts a slow rotation of the stage, so that the center of rotation can be found. This region is then placed by the operator of the microscope in the middle of the field of view, and zoomed in. The liquid dispensing arm then swivels into the center of the sample and the first precursor is pumped in, squirting enough precursor to cover the entire field of view. Then the spin-coating stage's motor is accelerated to a few thousand RPMs/s, and then kept at a few thousand RPMs for several seconds until a uniform liquid film is formed on the surface of the sample. The pressure of the ESEM can be regulated at this point between 5.5 and 6 Torr to get a consistent thin liquid film. Once this film is formed, the spin-coating motor is stopped and an electron beam lithography package is used to pattern the liquid film with the electron beam. Depending on the nature of the precursor, either conductors, insulators, or semiconductors are deposited at this point. To add a next layer, a solvent rinse can be employed by spin-coating solvent on the surface of the sample. Then the next precursor can be pumped in and spin-coated in the same manner. A resolution of 10 nm, similar to that obtained with traditional electron beam lithography, is expected. The resolution of the deposits or their crystallinity can also be controlled with the use of an external bias on the sample via a voltage source.

There are two exemplary methods disclosed herein to further improve the rate at which materials can be deposited using this module. The first method is to track the rotational position of the sample with the combination of an interferometer and a rotary encoder so that a pattern does not have to be realigned with the underlying features on the sample once an initial alignment has been done, thus avoiding exposing a liquid precursor film by doing alignment of the pattern on the sample. The second method is to either rotate the electron beam pattern as it is exposed on the sample at the same rate at which the sample is spinning, or to scan a line pattern radially while synchronizing the position of the pattern with the rotation position, thus allowing a much faster exchange of the precursors to take place. For this, the electron beam scan generator control box is used. This feature can also prevent the formation of droplets on the surface of the sample, as liquid could be replenished continuously while exposing a pattern. Large areas of the sample could also be patterned in this way by adding X-Y motion to the sample stub as well as automatic mass balancing during rotation at high RPM.

In order to provide the option to have voids and self-supporting structures in a 3D nanoprint, a sacrificial filler material can be used. This precursor can be a negative tone electron beam resist or sacrificial metal, which can be later removed after the structure is completed with a selective etchant.

Numerous other advantages and features of the present invention will be become readily apparent from the following detailed description of the invention and the embodiments thereof, and from the accompanying drawings.

DETAILED DESCRIPTION

Figure 2:
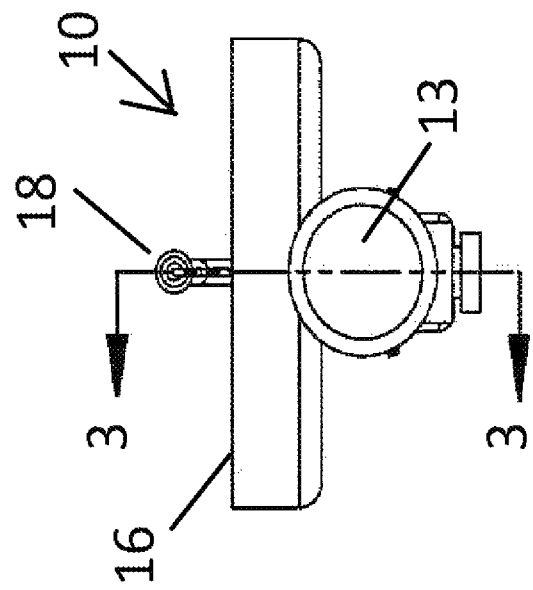
FIG. 2 is a schematic end view of the module shown in FIG. 1.

While this invention is susceptible of embodiment in many different forms, there are shown in the drawing, and will be described herein in detail, specific embodiments thereof with the understanding that the present disclosure is to be considered as an exemplification of the principles of the invention and is not intended to limit the invention to the specific embodiments illustrated.

Figure 1:
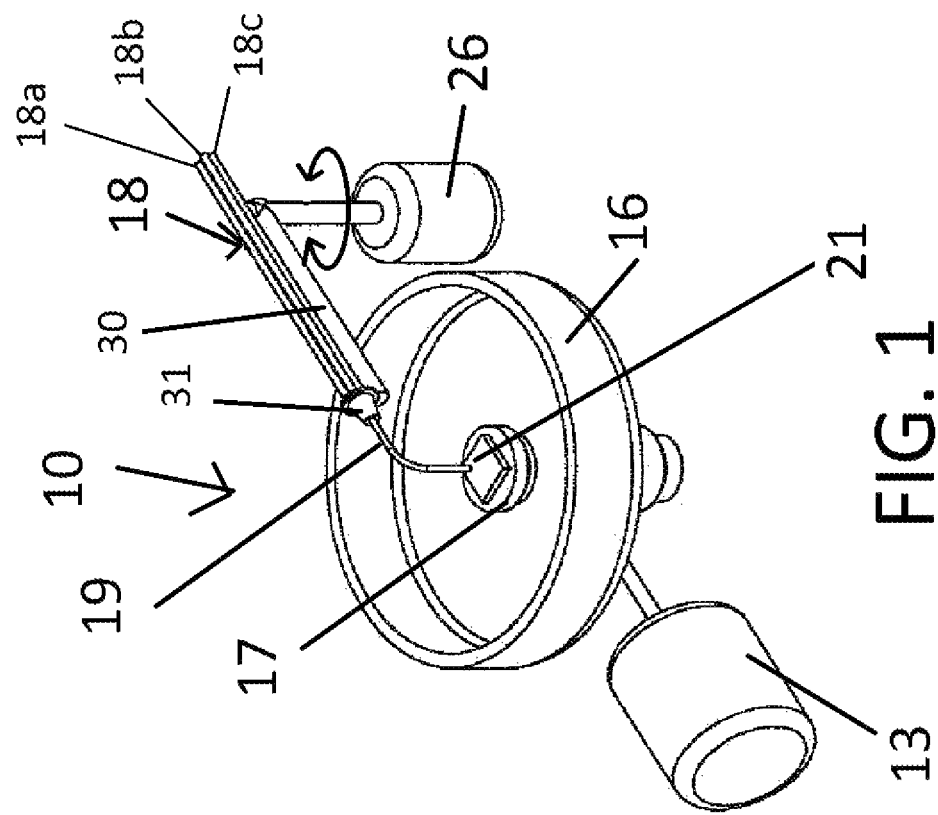
FIG. 1 is a schematic, perspective view of an exemplary module according to the invention.
Figure 3:
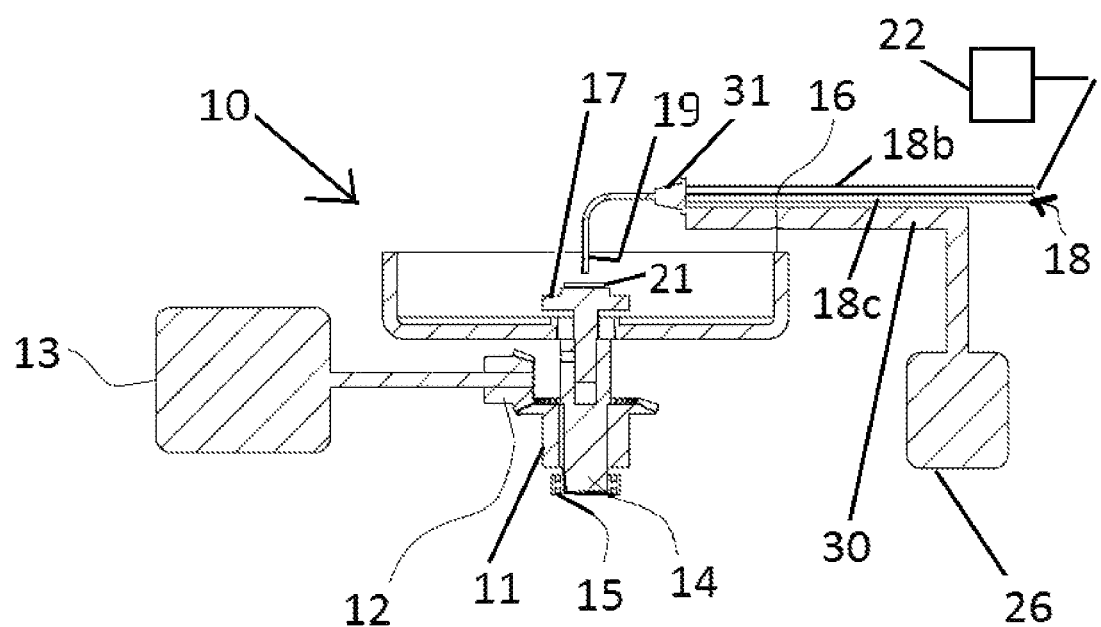
FIG. 3 is a schematic, sectional view taken through plane 3-3 of FIG. 2.

An exemplary embodiment electron beam lithography in-situ spin coating module 10 is shown in FIGS. 1-3. More detailed descriptions of example spin coating devices are described in U.S. Pat. Nos. 7,276,118 and 6,162,295, herein incorporated by reference to the extent they are not incompatible with the teachings and embodiments of the present disclosure.

A bevel gear 11 is engaged to a pinion gear 12, the pinion gear rotated by a motor 13 that is controlled by the computer control of the system. Rotation of the pinion gear rotates the bevel gear.

A sample holder rod 14 is inserted into the bevel gear 11, and fixed for rotation therewith. The sample rod holder 14 is journaled by a bearing 15 that is supported by an external structure (not shown) in thermal contact with the cold end of the cooling SEM stage. A liquid waste collection cup 16 is located above and surrounding the sample holder rod 14.

A spin-coating sample stub 17 holds a sample 21 to be coated, and is connected to the sample rod holder 14 to rotate therewith. Liquid is dispensed on the sample, such as a substrate 21 through a liquid dispensing arm 30 holding a tube bundle 18, including one, two or more tubes 18*a*, 18*b*, 18*c*, each delivering a selected desired liquid, and thereafter through a manifold 31 and though a discharge, such as a syringe 19. The liquid dispensing tube bundle 18 has tubing connections to micro syringe pumps 22 which communicate the desired liquid for coating the substrate or a top layer of material on the substrate. The liquid dispensing arm 30 can be pivoted about a vertical axis by a servomotor 26 controlled by the computer control of the system to position the syringe 19 over the substrate 21.

Figure 4:
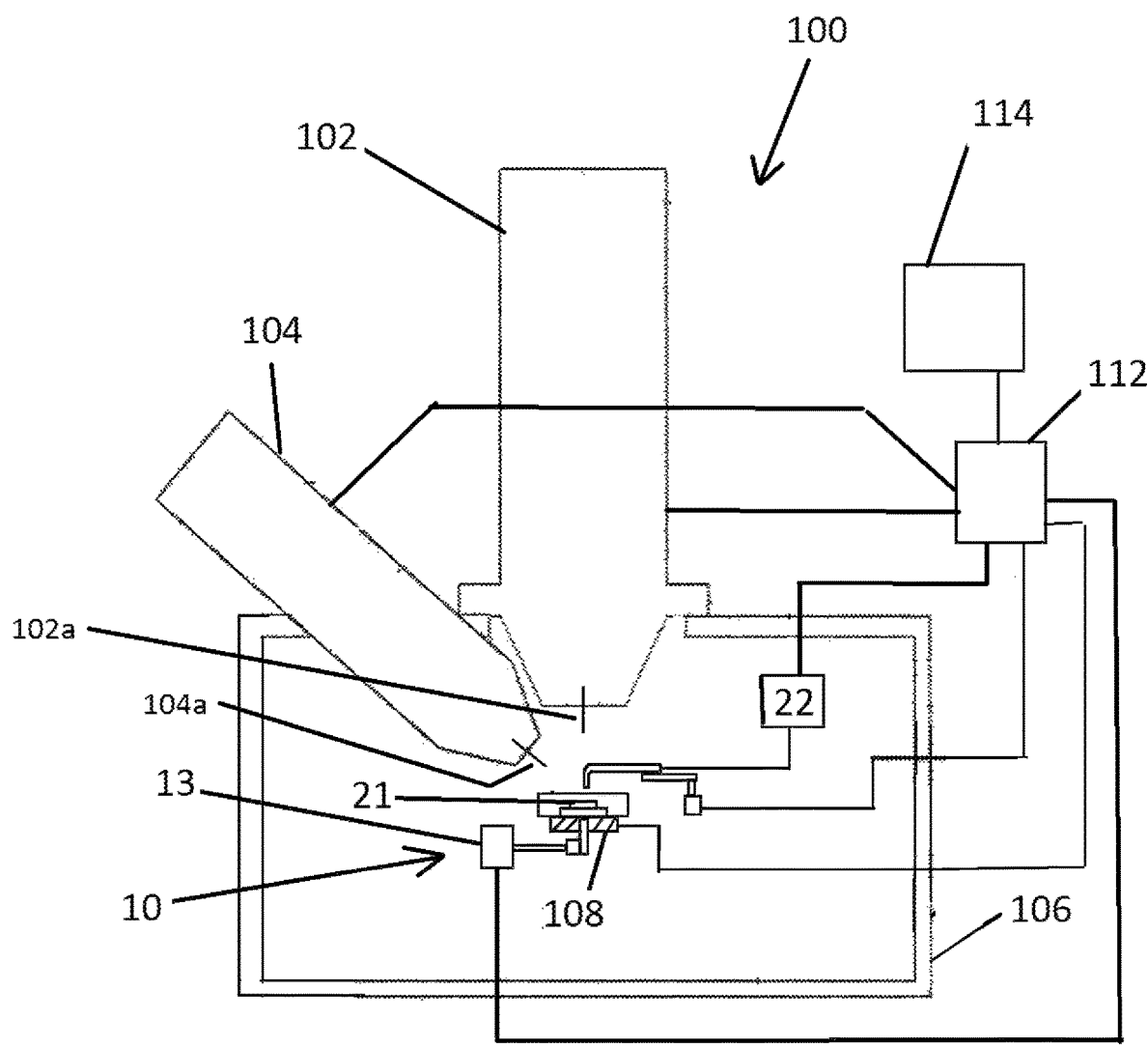
FIG. 4 is a schematic diagram of the module within a system.

FIG. 4 illustrates the module 10 within a lithography apparatus 100. Such an apparatus 100, without the module 10, is generally disclosed in detail in US Published Patent Application 2018/0114671, herein incorporated by reference in its entirety, to the extent it is not incompatible with the teaching of the present application. US Published Patent Application 2018/0178227 also describes electron beam induced processing and is also herein incorporated by reference in its entirety, to the extent it is not incompatible with the teaching of the present application.

The apparatus 100 can include an electron beam column 102 that delivers an electron beam 102*a* to a surface of the substrate 21 or to a top layer deposited thereon, and/or an ion beam column 104 that delivers an ion beam 104*a* to the surface of the substrate 21 or to a top layer deposited thereon. The electron beam column and/or the ion beam column can be used for processing or machining operations, such as incising, milling, etching, depositing, etc. The substrate and the module 10 are located within a vacuum chamber 106. A source of cooling 108, such as a Peltier cooler, in the form of a ring or bar, cools the spin-coating sample stub 17. An example of a Peltier cooler is found at https://www.emsdiasum.com/microscopy/products/equipment/coolin_stage.aspx describing the COOLSTAGE for SEM, a Peltier-driven SEM cooling stage for scanning electron microscopy, model numbers 90100-90104. Other examples of Peltier coolers are described in U.S. Pat. No. 5,654,546 and US Published Patent Application 2004/101003, both herein incorporated by reference in their entireties, to the extent they are not incompatible with the teaching of the present application. A computer control 112 controls the operation of the electron beam column and/or the ion beam column. A user interface 114, such as a monitor, keyboard, mouse, etc. allows operator observation and control of the system. The control 112 also controls operation of the module 10, including the operation of the motor 13 which controls the spinning of the sample stub 17, the operation of the servo motor 26 which positions the dispensing arm 30, the flow of a selected liquid between the pumps 22 and the dispending tube bundle 18, and the operation of the cooler 108.

Figure 5:
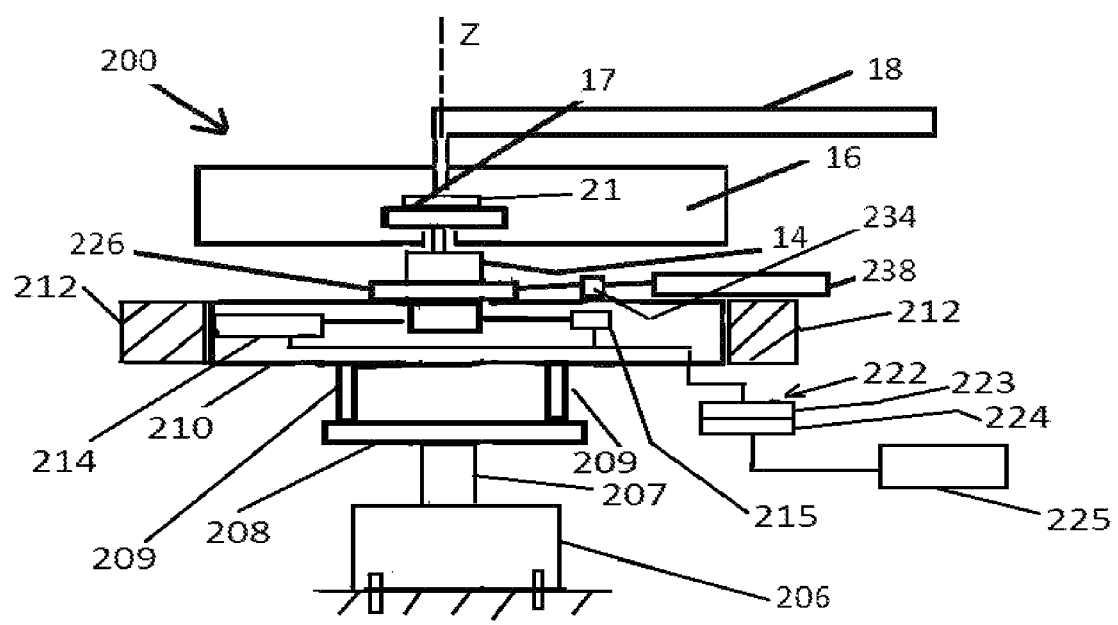
FIG. 5 is a schematic diagram of a further exemplary embodiment module.

FIG. 5 describes an enhancement to the module of FIGS. 1-3. An X-Y stage is provided in addition to the spin stage provided by the motor 13 in FIGS. 1-3. Also, an optical system is added to precisely measure the position of the workpiece.

The module 200 of FIG. 5 includes the sample stub 17, carried by the sample holder rod 14, the cup 16, the liquid dispensing arm 30, the tube bundle 18 and the corresponding components, as in FIGS. 1-3.

A housing of a spin motor 206 is fastened to a stationary portion of the system. A motor output shaft 207 is fastened to a bracket 208 that is fastened by elements 209 to an X-Y stage 210. The X-Y stage 210 is spun about the vertical, Z axis by the motor output shaft 207 and is guided by stationary structure in the form of a ring 212. The X-Y stage includes an X direction positioning mechanism 214 (X direction being horizontal, and across the page), and a Y direction positioning mechanism 215 (Y direction being horizontal, and into the page). The mechanisms 214, 215 are operationally connected to, and act to position, the sample holder rod 14 in the horizontal plane while the X-Y stage 210, including the sample holder rod 14, and the mechanisms 214, 215 are spun by the motor 206. To power the mechanisms for initiating translation motion, electric power is provided by a power source 225 through a slip ring 222 having a rotating part 223 in electrical contact with a stationary part 224. Signal lines can also be provided to the mechanisms 214, 215 though the slip ring 222, the slip ring having multiple concentric contact tracks. The X-Y stage can be controlled to move the sample holder rod 14 and the sample stub 17 in the X-Y directions within the horizontal plane. The motor 206 spins the stub 17, and any sample or workpiece carried on the stub, about the vertical, Z axis. The cup 16 is stationary and does not spin.

The motor 206 is shown as a direct drive motor but could also be the motor and gear arrangement (items 11, 12, 13, 14, 15) as shown in FIGS. 1-3. Also, the cooling stage 108 shown in FIG. 4 could also be applied to the module 200 shown in FIG. 5.

The motor output shaft 207 carries the X-Y stage 210. The X-Y stage 210 carries the sample stub 17, both of which can be spun simultaneously with movement of the sample stub in the X-Y, horizontal plane. The arrangement in FIG. 5 is shown schematically. There are other arrangements known for moving the workpiece within the horizontal plane in the X-Y directions and also rotating the workpiece. The X-Y stage can have a bottom Y stage, movable in the Y direction and an X stage, movable in the X direction, and carried on the Y stage, and a rotary stage carried on the X stage. Some mechanisms for undertaking these movements and rotations are disclosed, for example, in U.S. Pat. No. 8,058,628; and US Published Patent Applications 2002/0180133 and 2002/0047542 herein incorporated by reference to the extent they are not incompatible with the teachings and embodiments of the present disclosure.

An optical system measures all positions and attitudes of a very precise ring mirror 226 attached to the sample holder rod. A laser 238 and other mirrors and components interacts with the ring mirror 226. A rotary encoder 234 measures the angular position of the stub. These components as well as additional components such as additional mirrors can be configured as described in detail in U.S. Pat. No. 8,058,628 herein incorporated by reference to the extent it is not incompatible with the teachings and embodiments of the present disclosure.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. A lithography system for the deposition or etching of materials comprised of an in-situ spin-coating stage with a spin-coating motor, a spin-coating sample stub for holding a workpiece and driven by the spin-coating motor and connected either to an external power supply or ground, a liquid waste collector cup receiving liquid waste from the workpiece, a liquid dispensing arm having a discharge syringe and connected via tubing to micro-syringe pumps or a pressure driven flow controller, the liquid dispensing arm controlled for movement by a servo motor to position the discharge syringe over the workpiece, an electron or ion beam scan generator control box, and a computing system responsible for controlling the entire system.

2. The system according to claim 1, further comprising a cooling-SEM stage for cooling the sample stub.

3. The system according to claim 1, wherein the computing system exposes a lithography pattern on a workpiece as it is rotated at high speed.

4. The system according to claim 1, further comprising a tracking system including a rotary encoder and an interferometer to track the position of a sample on the sample stub.

5. The system according to claim 1, further comprising an X-Y movement stage for moving the sample stub with x-y motion to expose large area substrates.

6. The system according to claim 5, wherein the computing system is configured to automatically balance a mass of a rotating combination of the sample stub, the spin motor, the workpiece, and the X-Y stage due to motion relative to the rotation axis during rotation.

7. A lithography system comprising: vacuum chamber;
a spin-coating sample stub within the chamber;
a spin-coating motor operable to spin the spin-coating sample stub, and connected to an external power supply;
a liquid dispensing arm connected via tubing to a selected supply of liquid for coating, the liquid dispensing arm arranged above the sample stub to deliver liquid onto a workpiece held on the sample stub; and
an electron or ion beam generator providing an electron and/or ion beam into the chamber and onto the workpiece.

8. The system according to claim 7, further comprising a cooling device arranged to cool the sample stub within the chamber.

9. A spin-coating stage for a lithography module system, the spin-coating stage comprising a spin-coating motor, a spin-coating sample stub for holding a workpiece and driven to spin by the spin-coating motor, a liquid waste collector cup receiving liquid waste off the workpiece, and a liquid dispensing arm fluid-connected to a supply of fluid for spin coating, having a discharge over the sample stub, the dispensing arm controlled for pivotal movement by a servo motor to position the discharge over the sample stub.

10. The spin coating stage according to claim 9, comprising a control which allows exposure of a lithography pattern on a workpiece as it is rotated.

11. The spin coating stage according to claim 9, comprising a tracking system to track the position of a workpiece on the sample stub.

* * * * *